(12) United States Patent
Hamada

(10) Patent No.: US 7,706,184 B2
(45) Date of Patent: Apr. 27, 2010

(54) NONVOLATILE SEMICONDUCTOR MEMORY DEVICE

(75) Inventor: Makoto Hamada, Mountain View, CA (US)

(73) Assignee: Kabushiki Kaisha Toshiba, Tokyo (JP)

(*) Notice: Subject to any disclaimer, the term of this patent is extended or adjusted under 35 U.S.C. 154(b) by 26 days.

(21) Appl. No.: 11/966,376

(22) Filed: Dec. 28, 2007

(65) Prior Publication Data

US 2009/0168527 A1 Jul. 2, 2009

(51) Int. Cl.
*G11C 16/00* (2006.01)
(52) U.S. Cl. ............................ 365/185.12; 365/185.11; 365/185.22
(58) Field of Classification Search ............. 365/185.12
See application file for complete search history.

(56) References Cited

U.S. PATENT DOCUMENTS

| | | | | |
|---|---|---|---|---|
| 5,625,590 A | * | 4/1997 | Choi et al. ............. | 365/185.17 |
| 5,963,475 A | * | 10/1999 | Choi et al. ............. | 365/185.11 |
| 5,966,326 A | * | 10/1999 | Park et al. ............. | 365/185.11 |
| 6,735,116 B2 | * | 5/2004 | Lee et al. ............... | 365/185.17 |
| 7,499,323 B2 | * | 3/2009 | Park ...................... | 365/185.11 |
| 2006/0083096 A1 | * | 4/2006 | Yang .................... | 365/230.03 |
| 2008/0123423 A1 | * | 5/2008 | Kim ...................... | 365/185.11 |

* cited by examiner

*Primary Examiner*—Tan T. Nguyen
(74) *Attorney, Agent, or Firm*—Oblon, Spivak, McClelland, Maier & Neustadt, L.L.P.

(57) ABSTRACT

A nonvolatile semiconductor memory device includes a memory cell array having a plurality of word lines and a plurality of bit lines, and at least first and second page buffers to which the plurality of bit lines are connected. The plurality of word lines are divided into first and second word lines and the first and second word lines are arranged in positions corresponding to the at least first and second page buffers.

18 Claims, 7 Drawing Sheets

NONVOLATILE SEMICONDUCTOR MEMORY DEVICE

BACKGROUND OF THE INVENTION

This invention relates to a nonvolatile semiconductor memory device, and more particularly, to a NAND flash memory which can perform a data rewriting operation (write and erase operation).

Conventionally, a NAND flash memory is well known as a nonvolatile semiconductor memory device which can be subjected to an electrical data rewriting operation and suitably formed with high integration density and large capacity (increase in memory capacity).

Recently, the integration density of the NAND flash memory has been further increased with the improvement of the memory cell structure and the development of a fine patterning technique. Further, it is strongly required to increase the operation speed with an increase in the memory capacity.

However, in the recent NAND flash memory, the width of and the interval between word lines have been made small with the development of the fine patterning technique. Likewise, the width of and the interval between bit lines have also been made small. Therefore, the resistances of the word lines and bit lines have become larger; the coupling capacitances between word lines, between bit lines, and between word lines and bit lines have become large; and the influence of coupling noise has become large.

Further, in the recent NAND flash memory, peak currents during the read operation and verification operation become larger with an increase in the number of memory cells for each word line. As a method for reducing the peak currents, it is considered to separately perform the read and verification operations a plurality of times (for example, twice). However, in the case of this method, when the potential of a bit line which is first subjected to the read and verification operations is discharged (conducting cell), the potential of the word line fluctuates because of the coupling between the word line and the bit line. In this case, the next read and verification operations cannot be started until the potential of the word line returns to a preset value. The fluctuation in the potential of the word line becomes larger with an increase in the coupling capacitance between the word line and the bit line. That is, since the time length until the potential returns to the preset value becomes larger if the fluctuation in the potential of the word line becomes larger, there occurs a problem that the read and verification operations are delayed.

A NAND flash memory in which page buffers are divisionally driven is already proposed (for example, refer to U.S. Patent Specification No. 2006/0104125 A1).

BRIEF SUMMARY OF THE INVENTION

According to a first aspect of the present invention, there is provided a nonvolatile semiconductor memory device comprising a memory cell array having a plurality of word lines and a plurality of bit lines; and at least first and second page buffers to which the plurality of bit lines are connected; wherein the plurality of word lines are divided into first and second word lines and the first and second word lines are arranged in positions corresponding to the at least first and second page buffers.

According to a second aspect of the present invention, there is provided a nonvolatile semiconductor memory device comprising a memory cell array having a plurality of word lines and a plurality of bit lines; and at least first to fourth page buffers to which the plurality of bit lines are connected; wherein the plurality of word lines are divided into first and second word lines and the first and second word lines are arranged in positions corresponding to the at least first and third page buffers and the second and fourth page buffers.

DETAILED DESCRIPTION OF THE INVENTION

Embodiments of the present invention will be described with reference to the accompanying drawings. It should be noted that the drawings are schematic ones and the dimension ratios shown therein are different from the actual ones. The dimensions vary from drawing to drawing and so do the ratios of the dimensions. The following embodiments are directed to a device and a method for embodying the technical concept of the present invention and the technical concept does not specify the material, shape, structure or configuration of components of the present invention. Various changes and modifications can be made to the technical concept without departing from the spirit or scope of the claimed invention.

First Embodiment

Figure 1:
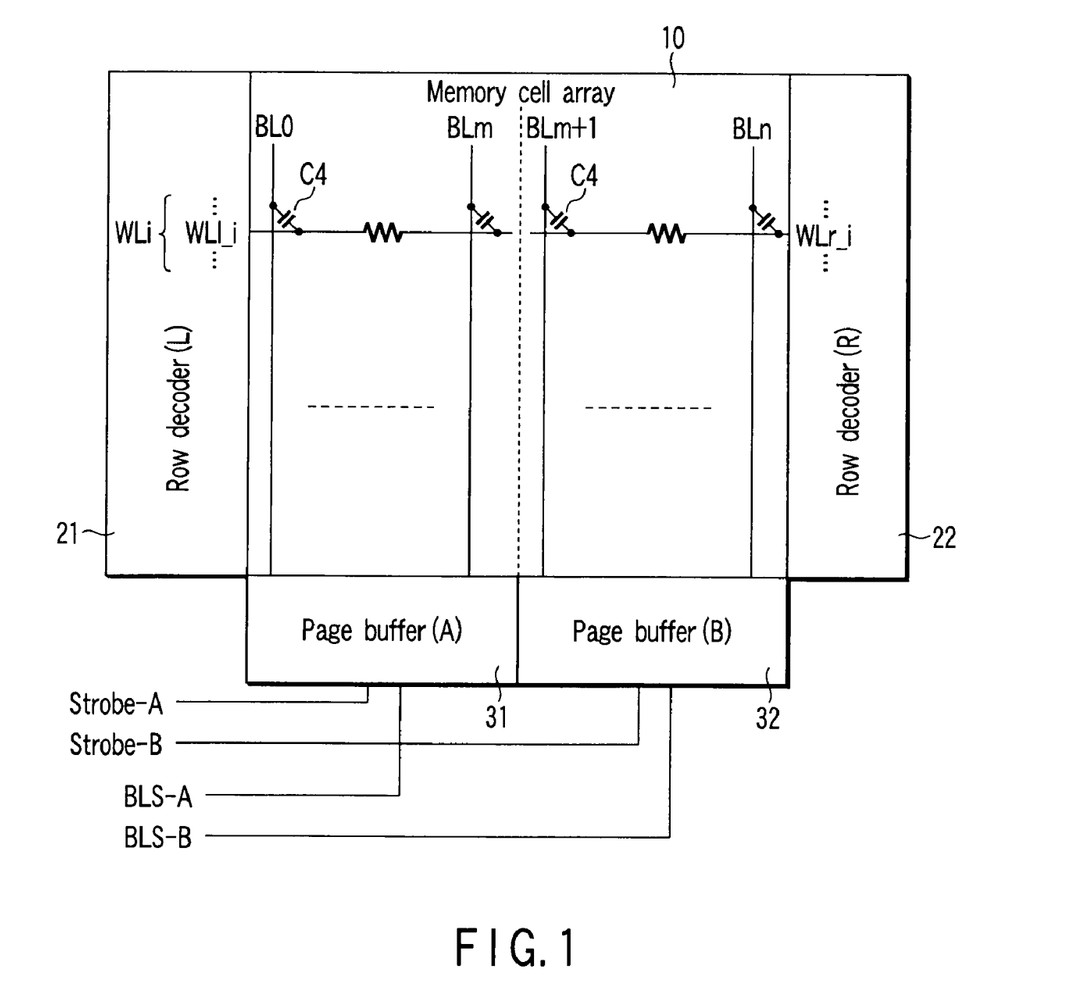
FIG. 1 is a block diagram showing an example of the configuration of a core portion of a NAND flash memory according to a first embodiment of this invention.

FIG. 1 shows an example of the configuration of a core portion of a semiconductor memory device according to a first embodiment of this invention. In the present embodiment, a case wherein a NAND flash memory which is a nonvolatile semiconductor memory device having memory cells (NAND cells) each configured by a metal oxide semiconductor (MOS) transistor having the double (stacked) gate structure is taken as an example is explained.

In the case of the present embodiment, for example, as shown in FIG. 1, a first row decoder (L) 21 is arranged for each block on the left side of a memory cell array 10 and a second row decoder (R) 22 is arranged for each block on the right side thereof. That is, a plurality of blocks are provided in the memory cell array 10 and each block is selected by using both of the row decoder (L) 21 and row decoder (R) 22.

For example, first and second page buffers (A) 31 and (B) 32 are arranged on the front side of the memory cell array 10. The first and second page buffers (A) 31 and (B) 32 respectively include a plurality of sense amplifiers (not shown). That is, the write operation of writing write data to a corresponding memory cell transistor and the read operation of reading data from a corresponding memory cell transistor are performed by use of the first, second page buffers (A) 31 and (B) 32.

In the present embodiment, a plurality of word lines WLi in each block are divided into two portions of first word lines WLl_i and second word lines WLr_i. The first word lines WLl_i and second word lines WLr_i are respectively divided in correspondence to the first and second page buffers (A) 31 and (B) 32. That is, the first word lines WLl_i are connected at one-side ends to the first row decoder (L) 21 and selectively driven by the first row decoder (L) 21. Further, the second word lines WLr_i are connected at one-side ends to the second row decoder (R) 22 and selectively driven by the second row decoder (R) 22. Bit lines BL0 to BLm corresponding to the first word lines WLl_i among a plurality of bit lines BL0 to BLn are connected at one-side ends to the first page buffer (A) 31. Likewise, the bit lines BLm+1 to BLn corresponding to the second word lines WLr_i are connected at one-side ends to the second page buffer (B) 32. With this connection, a preset number of memory cell transistors selected by one of the first word lines WLl_i are subjected to the write data writing operation and read data reading operation by the page buffer (A) 31 via the bit lines BL0 to BLm. Likewise, a preset number of memory cell transistors selected by one of the second word lines WLr_i are subjected to the write data writing operation and read data reading operation by the page buffer (B) 32 via the bit lines BLm+1 to BLn.

Figure 2:
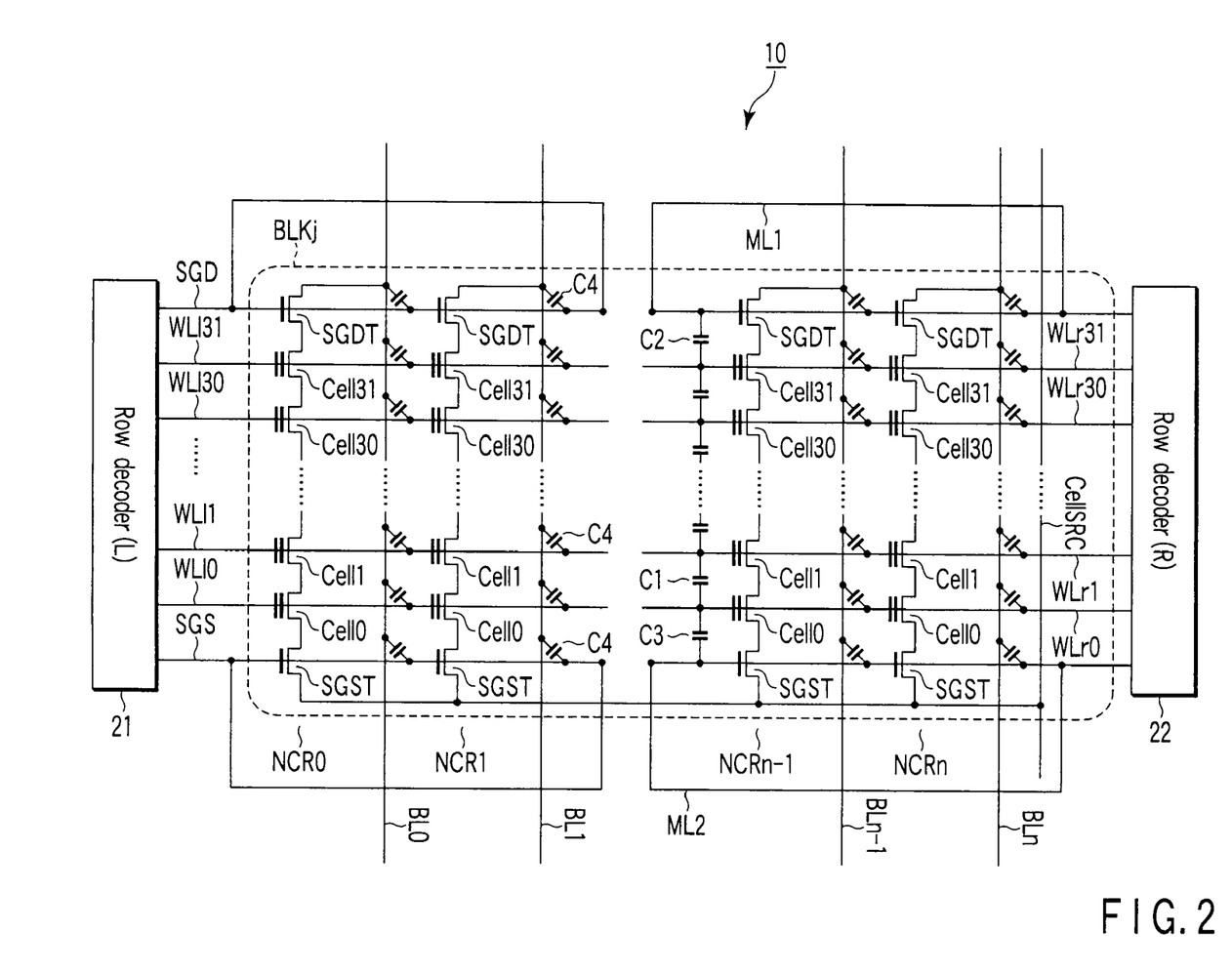
FIG. 2 is a diagram showing an example of the configuration of a memory cell array which configures the core portion shown in FIG. 1.

FIG. 2 shows the configuration of the core portion (memory cell array) shown in FIG. 1 in detail. In FIG. 2, one block is taken as an example. For example, the block BLKj is configured by a plurality of NAND cell strings NCR0 to NCRn. The NAND cell strings NCR0 to NCRn are each configured by serially connecting a source-side control transistor SGST, a preset number of (in this example, 32) memory cell transistors Cell0 to Cell31 and drain-side control transistor SGDT. The NAND cell strings NCR0 to NCRn are respectively connected to the bit lines BL0 to BLn and cell source line CellSRC. That is, the sources of the source-side control transistors SGST of the NAND cell strings NCR0 to NCRn of the block BLKj are commonly connected to the cell source line CellSRC and the drains of the drain-side transistors SGDT thereof are respectively connected to the bit lines BL0 to BLn. In addition, the source-side control transistors SGST of other blocks BLKj are commonly connected to the cell source line CellSRC.

In the block BLKj, the gates of the drain-side control transistor SGDT of the NAND cell strings NCR0 to NCRn are commonly connected to a drain-side control signal line SGD and the gates of the source-side control transistor SGST thereof are commonly connected to a source-side control signal line SGS. The drain-side control signal line SGD and source-side control signal line SGS are connected to the row decoders (L) 21 and (R) 22 corresponding to the block BLKj.

The drain-side control signal line SGD of each block BLKj is divided into two signal lines. A metal inter connect ML1 is connected to each of the two signal lines in a ladder form in the memory cell array 10. Likewise, the source-side control signal line SGS of each block BLKj is divided into two signal lines. A metal interconnect ML2 is connected to each of the two signal lines in a ladder form in the memory cell array 10. The metal interconnects ML1 and ML2 may be formed to lower the interconnect resistances of the drain-side control signal line SGD and source-side control signal line SGS irrespective of the shapes thereof. With the above configuration, the drain-side control signal line SGD and source-side control signal line SGS can be formed to have smaller resistances in comparison with the word lines WLl_i (WLl0 to WLl31) and WLr_i (WLr0 to WLr31). Of course, it is possible to omit the metal interconnects ML1 and ML2.

The memory cell transistors Cell0 to Cell31 are MOS transistors having double gate structures and each have a control gate and floating gate. Each control gate is connected to one of the word lines WLl_i (WLl0 to WLl31) and WLr_i (WLr0 to WLr31). The word lines WLl_i (WLl0 to WLl31) are connected to the row decoder (L) 21 corresponding to the block BLKj, and the word lines WLr_i (WLr0 to WLr31) are connected to the row decoder (R) 22 corresponding to the block BLKj. That is, the memory cell transistors Cell0 to Cell31 of the NAND cell strings NCR0 to NCRm respectively connected to the bit lines BL0 to BLm in each block BLKj are respectively connected to the word lines WLl_i (WLl0 to WLl31). On the other hand, the memory cell transistors Cell0 to Cell31 of the NAND cell strings NCRm+1 to NCRn respectively connected to the bit lines BLm+1 to BLn are respectively connected to the word lines WLr_i (WLr0 to WLr31).

Generally, in the memory cell array 10, WL-WL capacitances C1, WL-SGD capacitance C2, WL-SGS capacitance C3, and BL-WL, BL-SGD and BL-SGS capacitances C4 are provided. Therefore, influences caused by transition of the bit lines BL0 to BLn at the read operation time and verify operation time and given to the word lines WLl_i and WLr_i are not small.

Figure 3:
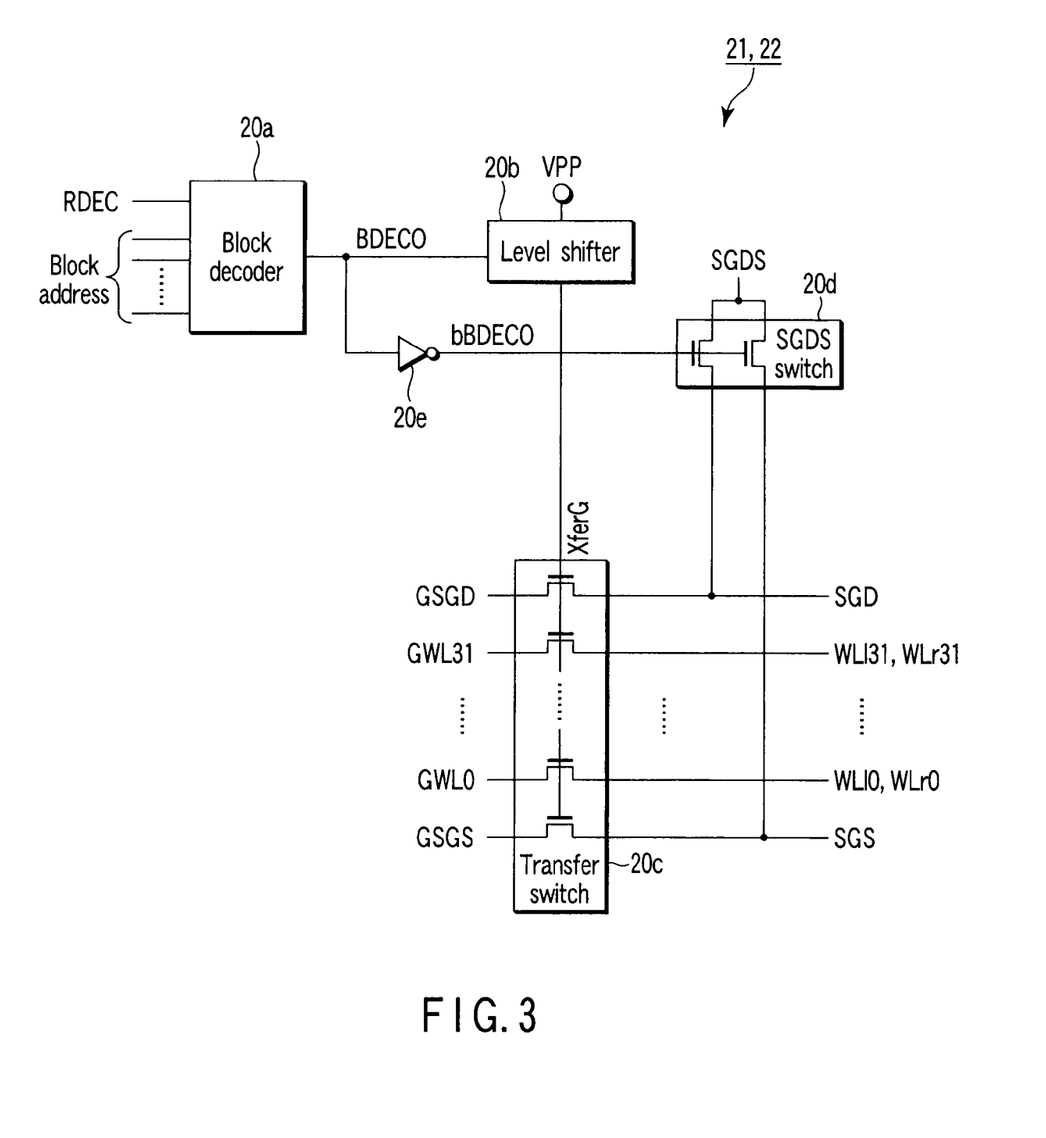
FIG. 3 is a diagram showing an example of the configuration of a row decoder which configures the core portion shown in FIG. 1.

FIG. 3 shows an example of the configuration of the row decoders (L) 21 and (R) 22. The row decoders (L) 21 and (R) 22 each include a block decoder 20a, level shifter 20b, operation voltage transfer switch 20c, control line potential connection switch (SGDS switch) 20d and inverter 20e. The operation voltage transfer switch 20c includes 34 nMOS transistors which control a connection between a global drain-side control signal line GSGD and the drain-side control signal line SGD, a connection between a global source-side control signal line GSGS and the source-side control signal line SGS and a connection between global word lines GWLi (GWL0 to GWL31) and the word lines WLl0 to WLl31 and WLr0 to WLr31. The control line potential connection switch 20d includes two nMOS transistors which control a connection between the control gate potential signal line SGDS and the drain-side control signal line SGD and a connection between the control gate potential signal line SGDS and the source-side control signal line SGS.

For example, assume that a row decoder activation signal RDEC from a control circuit (not shown) is made high. Then, the block decoder 20a decodes a block address from an address circuit (not shown). In the case of a selected block, the block decoder 20a makes an output signal BDECO high. When the output signal BDECO is high, a switch control signal bBDECO is made low by the inverter 20e. As a result, the control line potential connection switch 20d is turned off to break the connection between the control gate potential signal line SGDS and the drain-side control signal line SGD and the connection between the control gate potential signal line SGDS and the source-side control signal line SGS. Further, the level shifter 20b makes a gate potential control signal line XferG high in response to the high output signal BDECO and raises the voltage applied to the operation voltage transfer switch 20c until the voltage is at such a high level (VPP [transfer gate potential]) that the operation voltage transfer switch 20c can sufficiently transfer the potential. As a result, the operation voltage transfer switch 20c respectively transfers the potential of the global drain-side control signal line GSGD to the drain-side control signal line SGD, the potentials of the global word lines GWL0 to GWL31 to the word lines WLl0 to WLl31 and WLr0 to WLr31, and the potential of the global source-side control signal line GSGS to the source-side control signal line SGS.

On the other hand, in the case of a non-selected block, the block decoder 20*a* keeps the output signal BDECO low. When the output signal BDECO is low, the level shifter 20*b* makes the gate potential control signal line XferG low. As a result, the operation voltage transfer switch 20*c* is turned off to respectively break the connection between the global drain-side control signal line GSGD and the drain-side control signal line SGD, the connection between the global word lines GWL0 to GWL31 and the word lines WLl0 to WLl31 and WLr0 to WLr31, and the connection between the global source-side control signal line GSGS and the source-side control signal line SGS. At this time, the inverter 20*e* makes the switch control signal bBDECO high and turns on the control line potential connection switch 20*d*. As a result, the control line potential connection switch 20*d* respectively makes the connection between the control gate potential signal line SGDS and the drain-side control signal line SGD and the connection between the control gate potential signal line SGDS and the source-side control signal line SGS.

With the above configuration, the row decoders (L) 21 and (R) 22 are each supplied with a row decoder activation signal RDEC. Further, the row decoders (L) 21 and (R) 22 are each supplied with a block address, transfer gate potential (VPP) and the potentials of the global word line GWLi, control gate potential signal line SGDS, global drain-side control signal line GSGD and global source-side control signal line GSGS. The transfer gate potential (VPP) and the potentials of the global word line GWLi, control gate potential signal line SGDS, global drain-side control signal line GSGD and global source-side control signal line GSGS are supplied from a core control drive circuit (not shown). Thus, the word lines WLl_i and WLr_i arranged on the left and right sides can be independently selected. As a result, when the read and verification operations are separately performed a plurality of times (for example, twice) to reduce the peak current, the levels of the word lines WLl_i and WLr_i can be prevented from greatly fluctuating. That is, even when the levels of the word lines WLl_i fluctuate because of the coupling between BL and WL caused by the read and verification operations of the memory cell transistors Cell0 to Cell31 selected by the word lines WLl_i, the fluctuation can be prevented from being transmitted to other word lines WLR_i.

Figure 4:
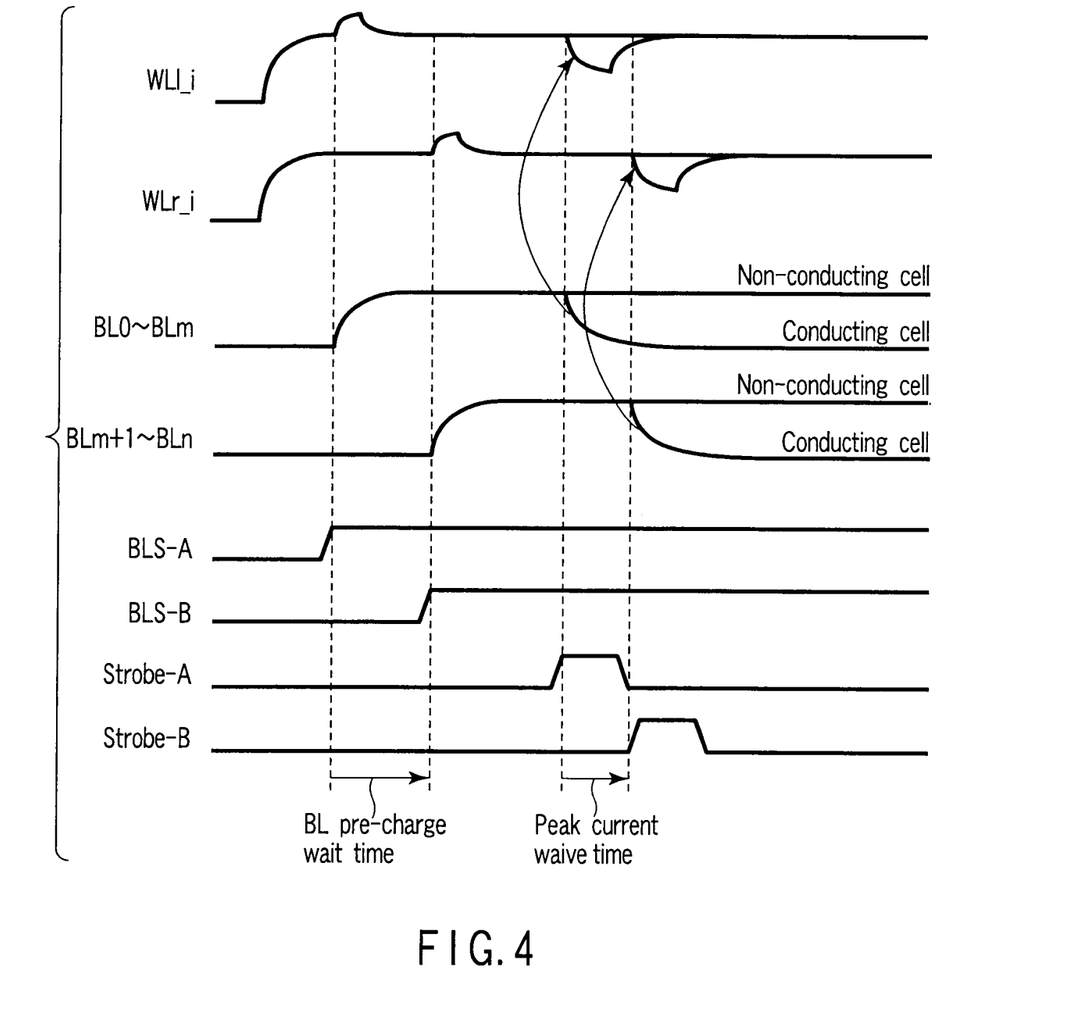
FIG. 4 is a timing chart for illustrating the read and verification operations according to the present embodiment.

FIG. 4 illustrates the read and verification operations by taking a case wherein the read and verification operations are performed twice as an example. In this case, the all bit line selection sensing (ABL) system is taken as an example.

In FIG. 4, signals BLS-A and BLS-B are gate signals of transistors (not shown) which control the connection between the bit lines BL0 to BLn and respective sense amplifiers. Signals Strobe-A, Strobe-B are signals which control the memory cell transistors Cell0 to Cell31 according to the result of the read and verification operations. When the memory cell transistors Cell0 to Cell31 are set in the conducting state (conducting cells), the signals are made high to discharge the potentials of the corresponding bit lines BL0 to BLn. On the other hand, when the memory cell transistors are set in the non-conducting state (non-conducting cells), the signals are kept low to maintain the precharge state.

For example, as shown in FIG. 4, when the read and verification operations are separately performed twice, first, the word lines WLl_i and WLr_i are almost simultaneously selected by the row decoders (L) 21 and (R) 22. After this, the bit lines BL0 to BLm are precharged by the high BLS-A signal. Then, after a preset time (BL pre-charge wait time) has elapsed, the bit lines BLm+1 to BLn are precharged by the high BLS-B signal.

First, the read and verification operations of the memory cell transistors Cell0 to Cell31 selected by the word lines WLl_i are started. Then, if the memory cell transistors Cell0 to Cell31 are conducting cells, charges of a corresponding one of the bit lines BL0 to BLm are discharged by the high Strobe-A signal. At this time, suppose that the level of the word line WLl_i fluctuates because of the coupling between BL and WL. However, the fluctuation in the level of the word line WLl_i is not transmitted to the word lines WLr_i. That is, the word lines WLl_i and WLr_i are divided for the respective page buffers (A) 31 and (B) 32. Therefore, the influence caused by discharging of the bit lines BL0 to BLm is not transmitted to the word line WLr_i used to perform the next read and verification operations. Therefore, it is not necessary to wait until the level of the word line WLl_i is set to a preset value and the read and verification operations of the memory cell transistors Cell0 to Cell31 selected by the word line WLr_i can be started immediately after a preset time (Peak current waive time) has elapsed. Therefore, the speed of the read and verification operations can be increased when the read and verification operations are separately performed twice in order to reduce the peak current.

When the memory cell transistors Cell0 to Cell31 selected by the word line WLr_i are conducting cells, charges of a corresponding one of the bit lines BLm+1 to BLn are discharged by the high Strobe-B signal. Further, when the memory cell transistors Cell0 to Cell31 selected by the word lines WLl_i, WLr_i are non-conducting cells, charges of the corresponding bit lines BL0 to BLm, BLm+1 to BLn are maintained by the low Strobe-A and Strobe-B signals.

As described above, each word line is divided into two portions and the two word interconnect portions are respectively arranged in correspondence to the page buffers. That is, the page buffers are divided into two groups and the word lines are divided into two portions in the dividing positions. Thus, when the read and verification operations are separately performed twice in order to reduce the peak current, an influence caused by discharging of the bit lines corresponding to one of the word lines can be prevented from being transmitted to the other word lines. Therefore, the read and verification operations for the other word lines can be immediately started and the speed of the read and verification operations can be increased.

In the present embodiment, a case wherein the number of divisions of the page buffers is set to two is explained. The division number of the page buffers is not limited to two, but it is necessary to set the position between at least two groups of the page buffers in correspondence to the dividing position (the boundary of division) of the word lines.

Second Embodiment

Figure 5:
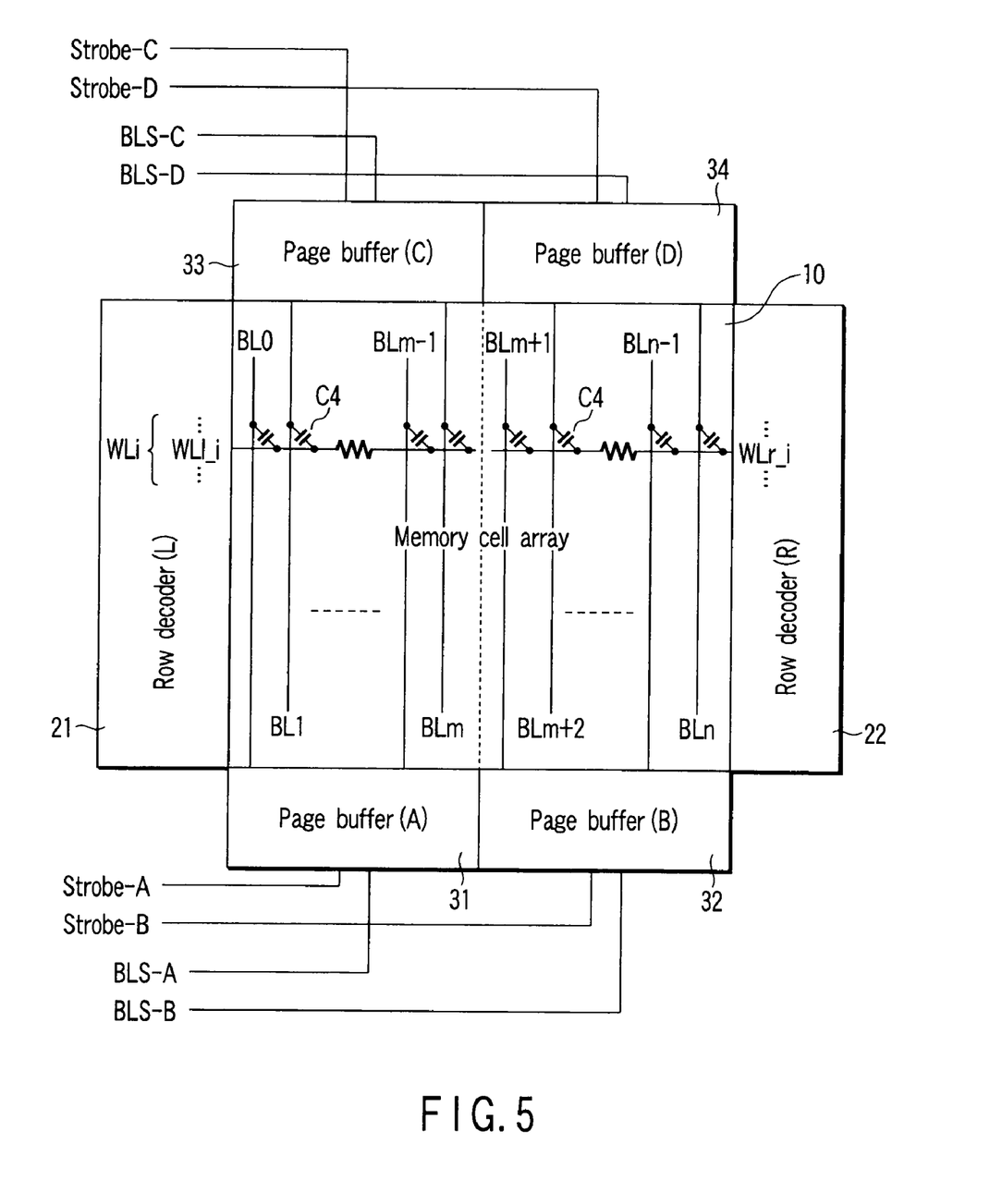
FIG. 5 is a block diagram showing an example of the configuration of a core portion of a NAND flash memory according to a second embodiment of this invention.

FIG. 5 shows an example of the configuration of a core portion of a semiconductor memory device according to a second embodiment of this invention. In the present embodiment, a case wherein a NAND flash memory which is a nonvolatile semiconductor memory device is taken as an example and the division number of the page buffers is further increased is explained. In this case, portions which are the same as those of the NAND flash memory explained in the first embodiment are denoted by the same reference symbols and the detail explanation thereof is omitted.

In the case of the present embodiment, for example, first, second page buffers (A) 31 and (B) 32 are arranged on the front side of a memory cell array 10. Further, for example, third and fourth page buffers (C) 33 and (D) 34 are arranged on the depth side of the memory cell array 10. The page buffers (A) 31, (B) 32, (C) 33, and (D) 34 have a plurality of sense amplifiers (not shown). That is, the operation of writing write data to corresponding transistors and reading read data from corresponding transistors is performed by use of the page buffers (A) 31, (B) 32, (C) 33, and (D) 34.

Bit lines BL0 to BLm among a plurality of bit lines BL0 to BLn are alternately connected to the page buffers (A) 31 and (C) 33. That is, the bit lines BL0, BL2, . . . , BLm−1 are connected to the page buffer (A) 31 and the bit lines BL1, BL3, . . . , BLm are connected to the page buffer (C) 33. Further, the bit lines BLm+1 to BLn among the plurality of bit lines BL0 to BLn are alternately connected to the page buffers (B) 32 and (D) 34. That is, the bit lines BLm+1, BLm+3, BLn−1 are connected to the page buffer (B) 32 and the bit lines BLm+2, BLm+4, . . . , BLn are connected to the page buffer (D) 34.

The page buffer (A) 31 is supplied with signals BLS-A and Strobe-A. The page buffer (B) 32 is supplied with signals BLS-B and Strobe-B. The page buffer (C) 33 is supplied with signals BLS-C and Strobe-C. The page buffer (D) 34 is supplied with signals BLS-D and Strobe-D.

Further, in the present embodiment, a plurality of word lines WLi in each block are divided into two groups of first word lines WLl_i and second word lines WLr_i. The first word lines WLl_i are connected at one-side ends to a first row decoder (L) 21 and selectively driven by the first row decoder (L) 21. Further, the second word lines WLr_i are connected at one-side ends to a second row decoder (R) 22 and selectively driven by the second row decoder (R) 22.

The positions in which the word lines WLl_i and WLr_i are divided correspond to the position in which the page buffers (A) 31 and (B) 32 are divided and the position in which the page buffers (C) 33 and (D) 34 are divided. That is, the page buffers (A) 31, (B) 32, (C) 33 and (D) 34 are arranged so as not to extend over the boundary between the word lines WLl_i and WLr_i.

Figure 6:
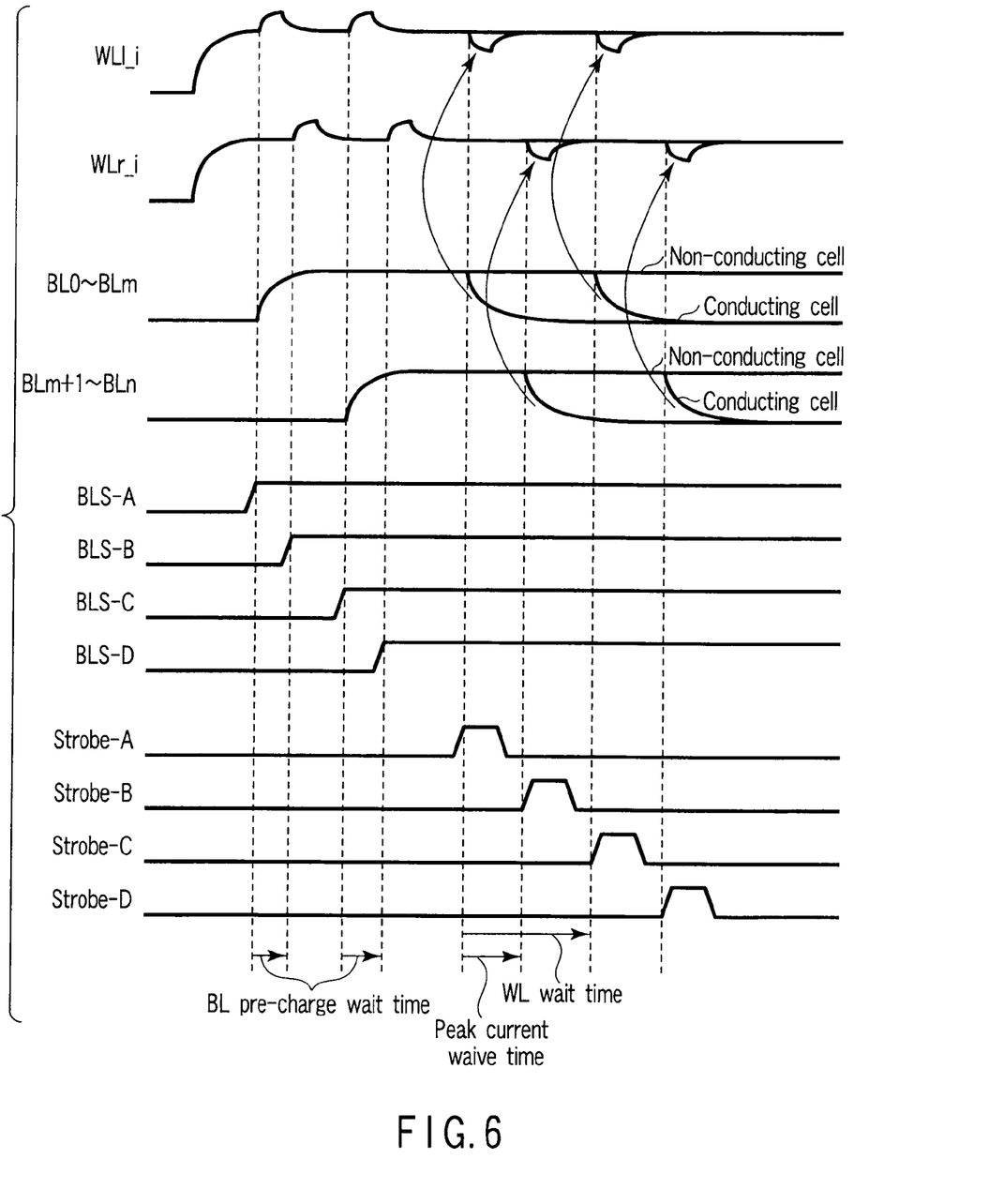
FIG. 6 is a timing chart for illustrating the read and verification operations according to the present embodiment.

In the case of the present embodiment, as shown in FIG. 6, for example, the read and verification operations are separately performed four times. At this time, the read and verification operations are alternately performed with the word lines WLl_i and WLr_i set as one unit. Thus, when a corresponding bit line is discharged (conducting cell) by the read and verification operations of the memory cell transistors Cell0 to Cell31 selected by one of the word lines, it is possible to eliminate a fluctuation in the potential of the word line caused by the coupling between BL and WL and given to the read and verification operations of the memory cell transistors Cell0 to Cell31 selected by the other word line. Therefore, since it is not necessary to wait until the level of the word line is set to a preset value, the speed of the read and verification operations can be increased when the read and verification operations are separately performed four times to reduce the peak current.

Also, in the case of this embodiment, the division number of the page buffers (A) 31 and (B) 32 and the page buffers (C) 33 and (D) 34 is not limited to two.

Third Embodiment

Figure 7:
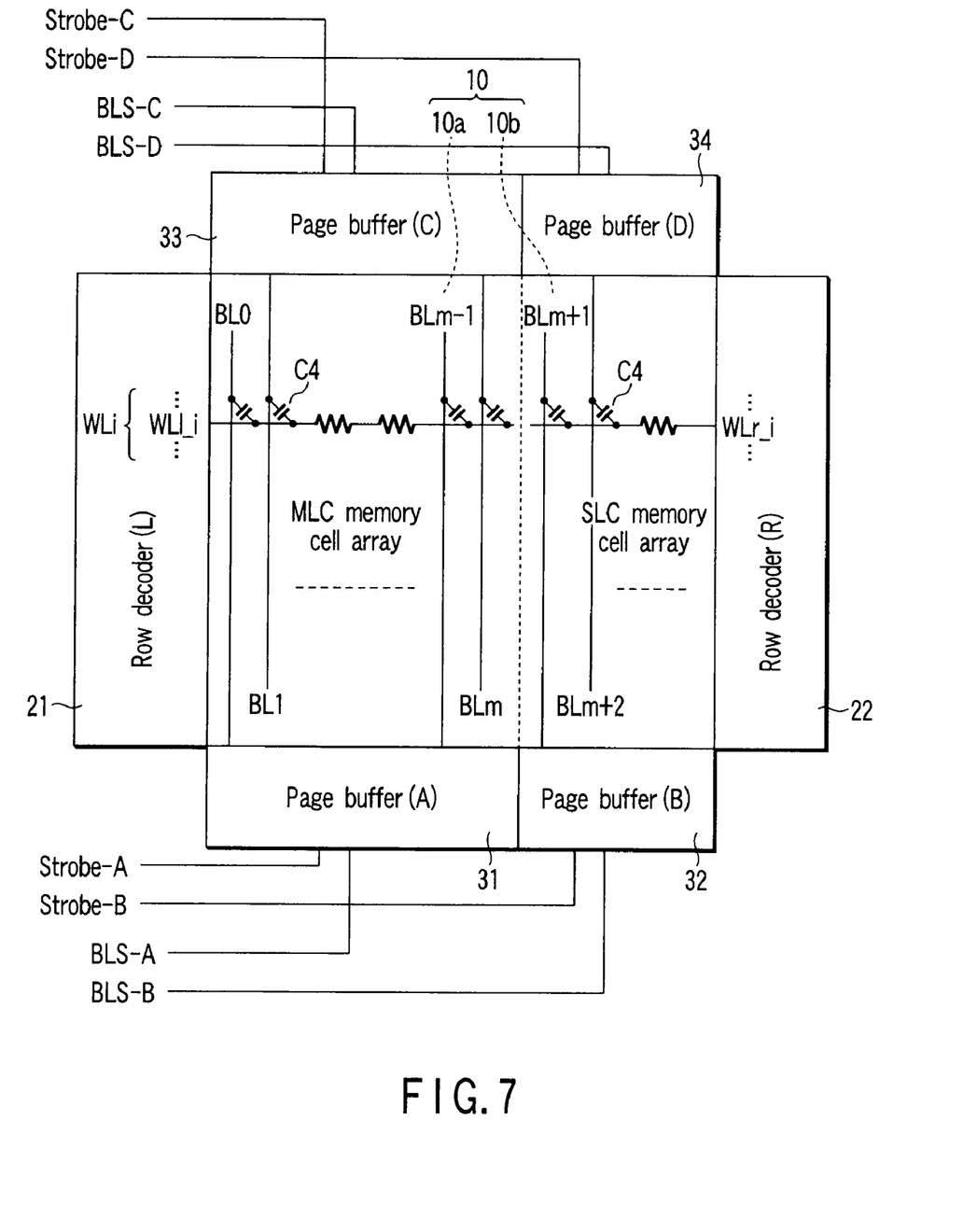
FIG. 7 is a block diagram showing an example of the configuration of a core portion of a NAND flash memory according to a third embodiment of this invention.

FIG. 7 shows an example of the configuration of a core portion of a semiconductor memory device according to a third embodiment of this invention. In the present embodiment, a case wherein a NAND flash memory which stores multi-value data in a nonvolatile fashion is taken as an example is explained. In this case, portions which are the same as those of the NAND flash memory explained in the second embodiment are denoted by the same reference symbols and the detail explanation thereof is omitted.

In the present embodiment, for example, a memory cell array 10 includes a first area (MLC memory cell array) 10a and second area (SLC memory cell array) 10b. The first area 10a is an area to store multi-value data of, for example, four or eight values and the second area 10b is an area to store binary data, for example.

Word lines WLi are divided into two groups of first word lines WLl_i and second word lines WLr_i, the first word lines WLl_i correspond to the first area 10a and the second word lines WLr_i correspond to the second area 10b. Further, page buffers (A) 31 and (C) 33 are arranged in correspondence to the first area 10a and page buffers (B) 32 and (D) 34 are arranged in correspondence to the second area 10b.

With the above configuration, an influence caused by discharging of a bit line corresponding to one of the word lines can be prevented from being given to the other word line. Thus, the read and verification operations for the other word line can be immediately started. Therefore, the speed of the read and verification operations can be increased when the read and verification operations are separately performed a plurality of times to reduce the peak current.

Particularly, in the case of a NAND flash memory which stores binary data and multi-value data, the read and verification operations can be performed for each of the areas 10a and 10b and the reliability can be further increased.

Also, in the case of this embodiment, the division number of the page buffers (A) 31 and (B) 32 and the page buffers (C) 33 and (D) 34 is not limited to two. For example, the page buffers (C) 33 and (D) 34 can be omitted as in the NAND flash memory shown in the first embodiment (refer to FIG. 1).

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor memory device comprising:
   a memory cell array having a plurality of word lines and a plurality of bit lines; and
   at least first and second page buffers to which the plurality of bit lines are connected;
   wherein the plurality of word lines are physically divided into first and second word lines corresponding to the at least first and second page buffers;
   wherein the memory cell array includes a plurality of blocks, a plurality of cell strings are provided in each of the plurality of blocks, the plurality of cell strings each include a drain-side selection transistor, a preset number of memory cells and a source-side selection transistor, and the preset number of memory cells are metal oxide semiconductor (MOS) transistors with stacked gate structures in each of which data is written and erased by use of an FN current and configure NAND cells;
   wherein a read and verification operations are separately performed twice for the NAND cell for each of the at least first and second page buffers in units of the first and second word lines.

2. The nonvolatile semiconductor memory device according to claim 1, which further comprises first and second row decoders and in which the first word lines are selected by the first row decoder and the second word lines are selected by the second row decoder.

3. The nonvolatile semiconductor memory device according to claim 1, wherein a dividing position between the first and second word lines coincides with a dividing position between the first and second page buffers.

4. The nonvolatile semiconductor memory device according to claim 1, wherein the at least first and second page buffers are arranged on one side of the memory cell array.

5. The nonvolatile semiconductor memory device according to claim 1, wherein the memory cell array includes first and second areas, the first page buffer among the at least first and second page buffers is arranged in correspondence to the first area and the second page buffer is arranged in correspondence to the second area.

6. The nonvolatile semiconductor memory device according to claim 5, wherein the first and second areas are areas to store binary data.

7. The nonvolatile semiconductor memory device according to claim 5, wherein the first area is an area to store multi-value data and the second area is an area to store binary data.

8. The nonvolatile semiconductor memory device according to claim 1, wherein the at least first and second page buffers are configured by a plurality of grouped page buffers.

9. A nonvolatile semiconductor memory device comprising:
a memory cell array having a plurality of word lines and a plurality of bit lines; and
at least first to fourth page buffers to which the plurality of bit lines are connected;
wherein the plurality of word lines are divided into first and second word lines and the first and second word lines are arranged in positions corresponding to the at least first and third page buffers and the second and fourth page buffers.

10. The nonvolatile semiconductor memory device according to claim 9, which further comprises first and second row decoders and in which the first word lines are selected by the first row decoder and the second word lines are selected by the second row decoder.

11. The nonvolatile semiconductor memory device according to claim 9, wherein the memory cell array includes a plurality of blocks, a plurality of cell strings are provided in each of the plurality of blocks, the plurality of cell strings each include a drain-side selection transistor, a preset number of memory cells and a source-side selection transistor, and the preset number of memory cells are metal oxide semiconductor (MOS) transistors with stacked gate structures in each of which data is written and erased by use of an FN current and configure NAND cells.

12. The nonvolatile semiconductor memory device according to claim 11, wherein a read and verification operations are separately performed four times for the NAND cell for each of the first to fourth page buffers in units of the first and second word lines.

13. The nonvolatile semiconductor memory device according to claim 9, wherein a dividing position between the first and second word lines coincides with a dividing position between the first and second page buffers and a dividing position between the third and fourth page buffers.

14. The nonvolatile semiconductor memory device according to claim 9, wherein the first and second page buffers among the at least first to fourth page buffers are arranged on one side of the memory cell array and the third and fourth page buffers are arranged on the other side of the memory cell array to face the first and second page buffers.

15. The nonvolatile semiconductor memory device according to claim 9, wherein the memory cell array includes first and second areas, the first and third page buffers among the at least first to fourth page buffers are arranged in correspondence to the first area and the second and fourth page buffers are arranged in correspondence to the second area.

16. The nonvolatile semiconductor memory device according to claim 15, wherein the first and second areas are areas to store binary data.

17. The nonvolatile semiconductor memory device according to claim 15, wherein the first area is an area to store multi-value data and the second area is an area to store binary data.

18. The nonvolatile semiconductor memory device according to claim 9, wherein the at least first to fourth page buffers are configured by a plurality of grouped page buffers.

* * * * *